United States Patent [19]

Clarke

[11] Patent Number: 6,086,947
[45] Date of Patent: Jul. 11, 2000

[54] METHOD OF DEPOSITING MATERIALS ON A WAFER TO ELIMINATE THE EFFECT OF CRACKS IN THE DEPOSITION

[75] Inventor: Andrew P. Clarke, Carpinteria, Calif.

[73] Assignee: Sputtered Films, Inc., Santa Barbara, Calif.

[21] Appl. No.: 08/729,015

[22] Filed: Oct. 10, 1996

[51] Int. Cl.[7] ........................................................ B05D 5/12
[52] U.S. Cl. ........................ 427/126.1; 427/299; 427/343; 427/399; 427/419.7
[58] Field of Search .................................. 427/126.1, 343, 427/399, 419.7, 299; 216/39; 204/192.1

*Primary Examiner*—Bernard Pianalto
*Attorney, Agent, or Firm*—Testa, Hurwitz & Thibeault, LLP

[57] ABSTRACT

A conductive adhesion layer (e.g. titanium 150 Å thick) is formed on a substrate. A first conductive barrier layer (e.g. high-density gold-colored titanium-nitride 300 Å thick) having properties of microcracking in a first direction to relieve inherent stress is deposited on the conductive adhesion layer. A second conductive barrier layer (e.g. low-density brown-colored titanium-nitride 400 Å thick) having properties of low inherent stress is deposited on the first barrier layer. The second barrier layer may be exposed to air, thereby further inhibiting the leakage to the substrate of material from a conductive layer (e.g. aluminum silicon copper or aluminum copper) when a third barrier layer (e.g. high-density gold-colored titanium nitride 300 Å thick) and such conductive layer are thereafter sequentially deposited on the second barrier layer. Such method may be used to provide a substantially uniform deposition on the walls of a groove for receiving a via. An insulating coating (e.g. silicon dioxide) may be deposited on the substrate and this coating may be etched to define the groove. The conductive layer and the first and second barrier layers may then be formed on the groove walls and the second layer may be exposed to air. The second barrier layer may then be etched as by argon to redistribute the second barrier layer into a substantially uniform thickness on the groove walls. The third barrier layer and the conductive layer may then be sequentially deposited on the second barrier layer in the groove.

26 Claims, 3 Drawing Sheets

METHOD OF DEPOSITING MATERIALS ON A WAFER TO ELIMINATE THE EFFECT OF CRACKS IN THE DEPOSITION

This invention relates to depositions on a substrate or a wafer. More particularly, the invention relates to depositions for preserving the optimal characteristics of the electrical circuitry on a wafer or a substrate over a wide range of changes in parameters such as temperatures or stresses. The invention also relates to methods of preserving such characteristics.

BACKGROUND OF THE INVENTION

Integrated circuit chips have now been fabricated for a few decades. During such period of time, the technology of fabricating the integrated circuit chips has been progressively advanced. For example, only a few years ago, the thickness of the electrical leads between different components on an integrated circuit chip was in the order of a few microns. Now the thickness of leads between different components in an integrated circuit chip is in the order of a small fraction of a micron. A few years ago, the rate of rejection of integrated circuit chips as a result of imperfect fabrication of the chips was relatively high in comparison to the present rate of rejection of integrated circuit chips. All of the above advances have resulted from significant improvements in the equipment for fabricating the chips and for checking the parameters of the chips after each successive layer has been deposited on the chips.

In spite of the considerable advances made over the years in equipment for, and methods of, fabricating integrated circuit chips and in the construction and operation of the integrated circuit chips, problems still remain. These problems have become aggravated as the micron thickness of the electrical leads between components has progressively decreased in size. Furthermore, the range of parameters for operating the integrated circuit chips has progressively increased, partially as a result of the use of the integrated circuit chips in applications not previously contemplated. For example, the range of operating temperatures and power levels in different applications has progressively increased so that uses resulting in microscopically localized temperatures as high as 600° C. are often required.

There are other instances where problems exist in integrated circuit chips even with the advances which have been made over the years. Grooves are often provided in integrated circuit chips for different purposes. For example, grooves are often provided to receive vias for interconnections between electrical components in different layers on the integrated circuit chip. The grooves are defined by walls which are coated with layers, called barrier layers, to provide material isolation. The grooves may then be filled with an electrically conductive material which constitutes the via. As the micron size of the leads on integrated circuit chips has decreased in size, the grooves have decreased in size.

It has been difficult to coat the walls of the grooves with barrier layers of a substantially uniform thickness. It has also been difficult to coat the walls of the grooves with barrier layer material so that conductive material from a conductive layer on the external surface of the groove wall will not leak through barrier layers disposed between the conductive layer and the substrate and affect the electrical properties of the substrate.

The difficulties of providing a satisfactory deposition of barrier layer material on the walls of a groove have been compounded because the range of operating parameters has increased through the years. For example, the range of microscopically localized operating temperatures of the integrated circuit chip has increased to approximately 600° C. and even higher. At such high temperatures, the barrier layers between the exposed conductive layers and the substrate provide diffusion paths for the material in the conductive layer to leak to the substrate along stress-relieving microcracks in the barrier layer. This conductive material has then combined with the substrate material and the combination has significantly lowered the electrical performance of the substrate so that the operation of the electrical circuitry on the substrate is significantly impaired.

BRIEF DESCRIPTION OF THE INVENTION

A conductive adhesion layer (e.g. titanium 150 Å thick) is formed on a substrate. A first conductive barrier layer (e.g. high-density gold-colored titanium-nitride 300 Å thick) having properties of microcracking in a first direction to relieve inherent stress is deposited on the conductive adhesion layer. A second conductive barrier layer (e.g. low-density brown-colored titanium-nitride 400 Å thick) having properties of low inherent stress is deposited on the first conductive barrier layer.

The second barrier layer may be exposed to air, thereby further inhibiting the leakage to the substrate of material from a conductive layer when a third barrier layer and such conductive layer are thereafter sequentially deposited on the second barrier layer. The third barrier layer may be high-density gold-colored titanium nitride 300 Å thick. The conductive layer may be aluminum silicon copper or aluminum copper.

Such method may be used to provide a substantially uniform deposition on the walls of a groove for receiving a via. An insulating coating (e.g. silicon dioxide) may be deposited on the substrate and this coating may be etched to define the groove. The conductive layer and the first and second barrier layers may then be formed on the groove walls and the second layer may be exposed to air. The second barrier layer in the groove may then be etched as by argon to redistribute the second barrier layer into a substantially uniform thickness on the groove walls. The third barrier layer and the conductive layer may then be sequentially deposited on the second barrier layer in the groove.

DETAILED DESCRIPTION OF THE INVENTION

Figure 1:
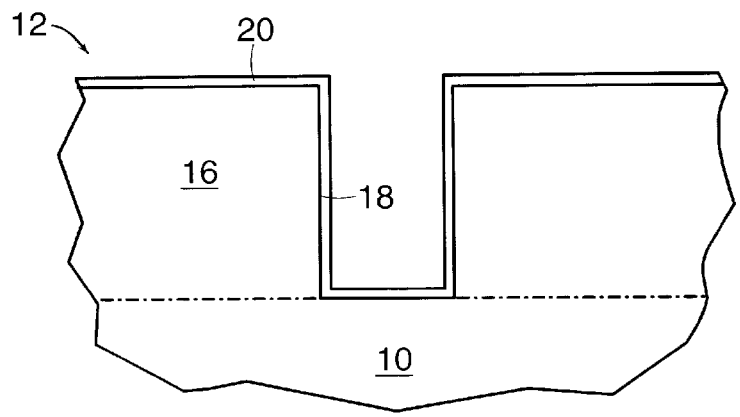
FIG. 1 is enlarged elevational view of an idealized groove which is in a partially formed semiconductor chip for receiving a via.

FIG. 1 shows a substrate 10 in a semiconductor chip generally indicated at 12. The substrate 10 may be formed from a suitable material such as silicon. As is well known in the prior art, different layers may be deposited on the substrate 10 in individual patterns to define electrical circuitry on a cumulative or interrelated basis. One of these layers may be formed from a suitable material such as silicon dioxide to provide electrical insulation. This insulating layer is indicated at 16.

A groove 18 may be formed in the layer 16. The groove 18 may be provided with dimensions to receive conductive material (not shown) which fills the groove and defines a via for interconnecting circuitry in different layers. FIG. 1 schematically illustrates a layer 20 of a conductive material such as titanium on the silicon dioxide layer 16 and on the walls defining the groove 18. As shown in FIG. 1, the layer 20 preferably has a uniform thickness, on an idealized basis, on the silicon dioxide layer 16 and on the walls of the groove 18.

Figure 2:
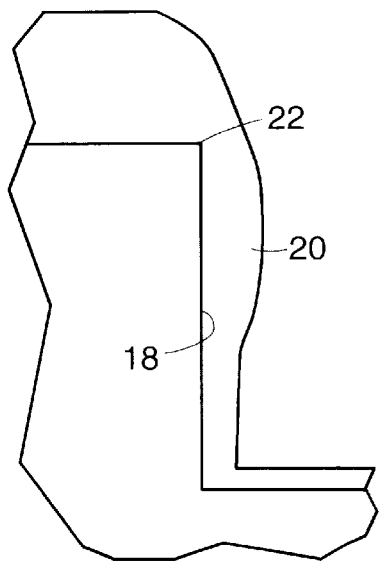
FIG. 2 is an enlarged fragmentary elevational view of one of the walls in the groove with a coating (e.g. titanium) on the wall, the shape of the coating being less than desirable and the titanium coating being formed under first particular operating conditions.

As will be appreciated, the thickness of the layer 20 on the silicon dioxide layer 16 and on the walls of the groove 18 is often not uniform. For example, FIG. 2 illustrates the configuration of the coating 20 when the thickness of the coating is less at a corner 22 of the groove 18 than the thickness of the coating on the layer 16 and on the walls of the groove at places other than the corner 22.

Figure 3:
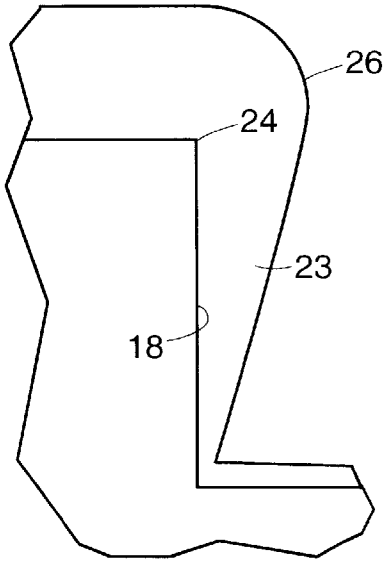
FIG. 3 is an enlarged fragmentary elevational view of one of the walls in the groove with a coating (e.g. titanium) on the wall, the shape of the coating being different than that shown in FIG. 2 but still less than desirable and the titanium coating being formed under second operating conditions different from the first operating conditions.

FIG. 3 illustrates the configuration of a coating 23 when the thickness of the coating is greater at a corner 24 of the groove 18 than the thickness of the coating on the layer 16 and on the walls of the groove at places other than the corner 22. This causes a shoulder or overhang 26 to be produced at the corner 24. As will be appreciated, the coating 23 may illustratively be made from a suitable material such as titanium.

In the situation shown in FIG. 3 where the coating 23 has the shoulder 26 (an excess of material) at the corner 24, various attempts have been made to eliminate the shoulder. For example, ions of a neutral gas such as argon have been applied to the shoulder 26 to eliminate the excess material at the shoulder. When argon ions impinge on the shoulder 26, titanium atoms sputtered from the shoulder move upwardly from the shoulder.

Figure 4:
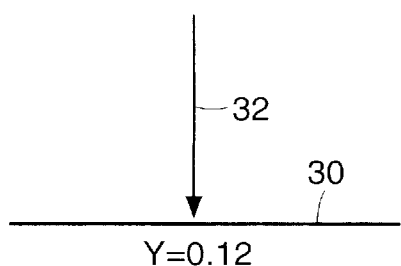
FIG. 4 is a schematic view of the application of argon atoms to a coating in a first direction to change the disposition of the coating on a support surface.

When argon atoms are directed to the coating 20 in a direction substantially perpendicular to the surface (as shown in FIG. 4) with a relatively high energy (e.g. 150 electron volts), a relatively low number of atoms are removed from the shoulder relative to the number of argon atoms that impinge on the shoulder. This proportion is indicated at Y in FIG. 4 and is shown as having a value of 0.12 (approximately twelve percent (12%)). The angle of incidence of the argon atoms on a surface 30 is indicated at 32 in FIG. 4.

Figure 5:
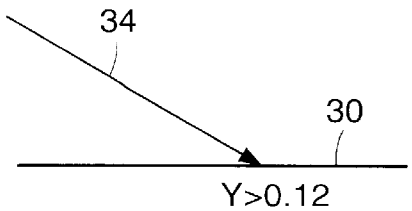
FIG. 5 is a schematic view of the application of argon atoms to a coating in a second direction to change the disposition of the coating on a support surface.

When the angle of incidence of the argon ions on the substrate 10 is relatively low, the efficiency of removing the excess material on the shoulder 26 is considerably increased above a value such as 0.12. This is shown in FIG. 5 where the angle of incidence on the surface 30 is indicated at 34 in FIG. 5 and where Y is shown as having a value considerably greater than 0.12.

Figure 6:
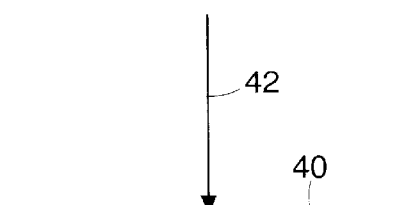
FIGS. 6 and 6A respectively show the direction of the application of ions with a high energy to a coating on a support surface and the distribution pattern of the atoms sputtered from the coating as a result of such ion application.
Figure 6A:
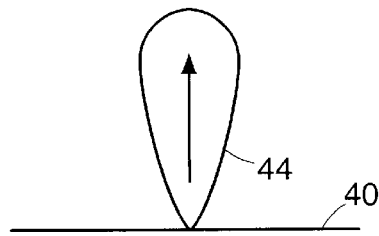

FIG. 6 indicates the movement of argon ions toward a surface 40 made from a material such as titanium with a high energy. This occurs when the argon ions have a high energy such as an energy greater than five hundred electron volts (>500 ev). As shown in FIG. 6 at 42, this movement of the argon ions is in a direction substantially perpendicular toward the surface 40. Under such circumstances, the spatial pattern of the titanium atoms sputtered from the surface 40 is indicated at 44 in FIG. 6A. This pattern is undesirable because the sputtered atoms of titanium will tend to redeposit high onto the opposite wall of the groove.

Figure 7:
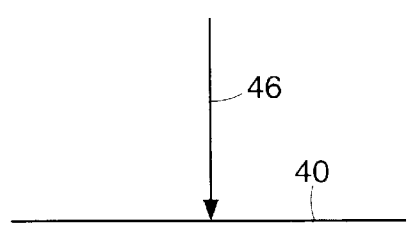
FIGS. 7 and 7A respectively show the direction of the application of ions with a low energy to a coating on a support surface and the distribution pattern of the ions sputtered from the coating as a result of such ion application.
Figure 7A:

FIG. 7 also indicates at 46 the movement of argon atoms toward the surface 40. However, in FIG. 7 the argon ions have a relatively low energy such as an energy less than approximately one hundred and fifty electron volts (150 ev.). Under such circumstances, the atoms sputtered from the surface 40 have a spatial pattern indicated at 48 in FIG. 7A. This pattern is more desirable than the pattern 44 because it causes the sputtered atoms to move in a direction away from the positions at which they were sputtered from the surface 40. The movement is away from such sputtered positions because the movement has a major component along the surface 40. This results in a re-deposition of the sputtered atoms onto the lower wall and floor of the groove.

Figure 8:
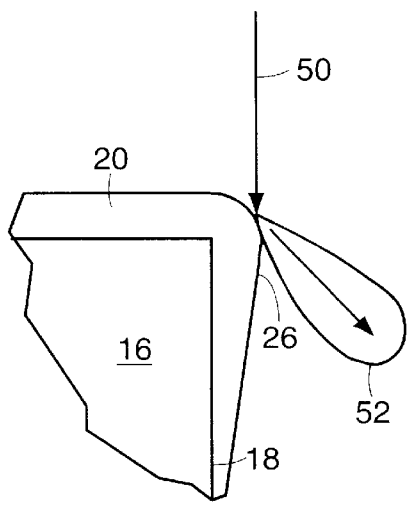
FIG. 8 is an enlarged fragmentary elevational view of a wall in a groove in a substrate and a coating on the wall with an overhanging thickness (a shoulder) of the coating on the wall and shows the direction in which ions are applied to the wall to remove the overhanging thickness in the coating.

FIG. 8 is a view similar to that shown in FIG. 3 and shows the groove 18 in the silicon dioxide layer 16 and further shows the layer 20 on the surface of the silicon dioxide layer and on the walls of the groove 18. As will be seen, the embodiment shown in FIG. 8 has the shoulder (or overhang) 26 also shown in FIG. 3. FIG. 8 also shows the direction of argon ions to the overhang 26 in a path schematically illustrated at 50. As will be seen, sputtered atoms leave the overhang 26 in a pattern indicated at 52 in FIG. 8. This corresponds to the pattern 48 in FIG. 7A. The departure of the sputtered atoms from the overhang 26 in the pattern 52 causes the overhang 26 to disappear and the thickness of the overhang to conform substantially to the thickness of the titanium on the surface of the silicon dioxide layer 16 and on the walls of the groove 18.

Figure 8A:
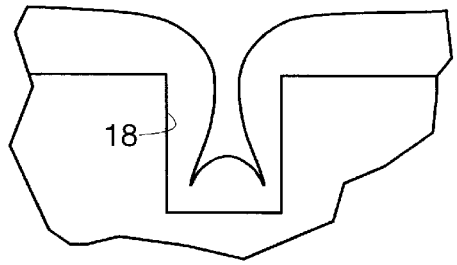
FIG. 8A is a schematic elevational view of a groove in a wall and the effect on the groove of overhanging thicknesses (shoulders) on the opposite walls of the groove.

FIG. 8A shows the pattern of the material such as titanium which is deposited on the opposite walls of the groove 18 when there is an overhang (or shoulder) on the opposite groove walls. This makes it difficult for any material thereafter deposited in the groove 18 to completely fill the groove. The resultant voids in the groove affect the operating characteristics (e.g. impedance) of the via formed in the groove 18.

Figure 9:
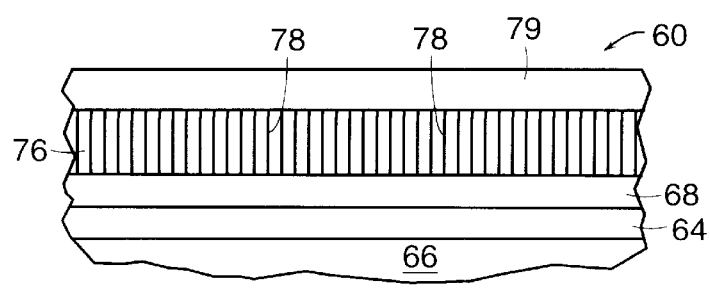
FIG. 9 is a schematic elevational view of a coating constituting one embodiment of the invention and formed from a plurality of layers including several layers formed from different types of titanium nitride.

FIG. 9 shows a coating generally indicated at 60 and constituting one embodiment of the invention. The coating 60 is formed from a plurality of layers. The coating 60 is shown as being disposed on a silicon substrate 66. However, it will be appreciated that the coating 60 may be disposed on the silicon dioxide layer 16 or on any substrate made from a material other than silicon or on a layer or coating made from a different material than silicon dioxide.

In the embodiment shown in FIG. 9, a layer 64 of a suitable material such as titanium may be deposited on a substrate 66 in a suitable thickness such as approximately one hundred and fifty Angstroms (150 Å). The layer 64 of titanium is desirable because it provides a good bonding to the silicon substrate 66 and to the layers of material disposed on top of it. A layer 68 of a suitable material such as gold-colored titanium nitride (TiN) may be deposited on the titanium layer 64 in a suitable thickness such as approximately three hundred Angstroms (300 Å). Gold titanium nitride has a density of approximately five grams per cubic centimeter (5 g/cm$^3$). Gold titanium nitride is known from the literature to be a highly dense zone 2 type of film usually characterized as having a low bulk resistivity of less than fifty microhm centimeters (50 $\mu$cm) and compressive stress in the order of 1–2 e$^{10}$ dyne centimeter. Gold titanium nitride may be identified by a distinctive gold color.

Gold titanium nitride films are typically good in situ barriers. They can be deposited on another layer and can be coated with a conductive material such as aluminum copper (AlCu) or aluminum copper silicon (AlCuSi), without any further treatment or air exposure, for interconnect contact to a material such as silicon. They can provide barrier properties to temperatures as high as 600° C. when they do not fail as a result of stress relief micro-cracking. Such micro cracks provide pathways for the aluminum in the aluminum copper or aluminum copper silicon to diffuse into the silicon substrate. Such diffusion is undesirable because it reduces the electrical properties of the silicon in the substrate.

Figure 14:
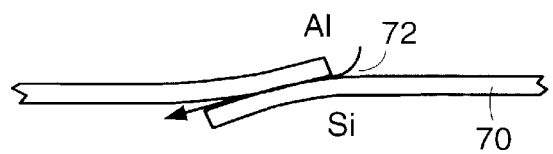
FIG. 14 is an enlarged fragmentary schematic elevational view of one of the layers shown in FIGS. 12 and 13 and shows a crack in the layer and the direction of transmigration of the conductive material above the layer through the crack toward the substrate.
Figure 15:
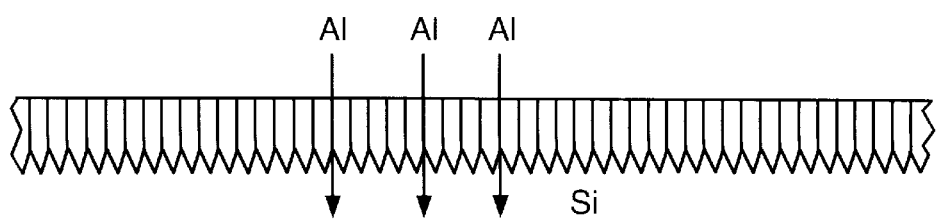
FIG. 15 is an enlarged fragmentary schematic elevational view of another of the layers shown in FIGS. 12 and 13 and shows cracks in such layer and the direction of the transmigration of the conductive material above the layer through the cracks toward the substrate.

A gold titanium nitride layer generally develops a crack under stress in the direction of the layer. For example, FIG. 14 shows a gold titanium nitride on an enlarged scale at 70 and shows a crack in the layer as at 72. As illustrated schematically in FIG. 14, aluminum (Al) from a position above the layer 70 diffuses through the crack 72 into the silicon substrate 66 below the layer and produces a considerable deterioration in the electrical properties of the silicon.

A layer 76 of a suitable material such as a brown titanium nitride is deposited on the gold titanium nitride layer 68 in a suitable thickness such as approximately four hundred Angstroms (400 Å). Brown titanium nitride is not as dense as gold titanium nitride since it has a density of approximately 3.22 g/cm$^3$. It has a columnar structure such as indicated at 78 in FIG. 9. It has a higher electrical resistivity and a low tensile stress, unlike gold titanium nitride. For example, the electrical resistivity of brown titanium nitride is greater than eighty microhm centimeter (80 $\mu$.cm). Brown titanium nitride has a bronze-gold color.

Brown titanium nitride films do not by themselves typically provide good barrier properties. One reason is that the brown titanium nitride provides inter-columnar voids in a direction 78 transverse or perpendicular to the surface of the layer 76. Because of the formation of the voids in the transverse or perpendicular direction 78, the columns in such direction 78 provide low impedance paths for the diffusion of a conductive material such as aluminum from the layer above the titanium nitride layer into the silicon substrate 66.

However, the brown titanium nitride absorbs water (H$_2$O) and oxygen (O$_2$) on the surfaces of the columnar cracks 78. When this occurs, it becomes difficult for the aluminum to diffuse through the columns. The columnar cracks 78 absorb the water and oxygen by exposing the brown titanium nitride to air. The water and oxygen in the air react with aluminum to create aluminum oxide (Al$_2$O$_3$) on the surfaces of the column 78 to inhibit the aluminum migration into the substrate 66.

FIG. 9 shows the deposition of a gold titanium nitride (TiN) layer 79 on the brown titanium nitride layer 78. The gold titanium nitride layer 79 has a suitable thickness such as approximately three hundred Angstroms (300 Å) and has the same characteristics as the gold titanium nitride layer 68. This includes the tendency to crack microscopically as shown schematically in FIG. 14.

Figure 10:
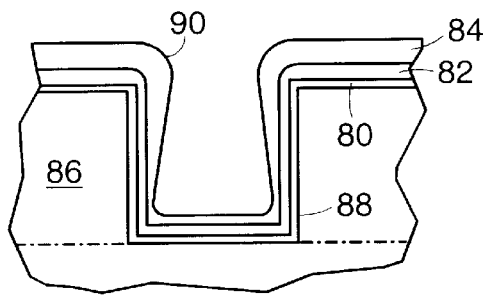
FIG. 10 is a view of a groove, similar to that shown in FIG. 1, of a groove in a partially formed semiconductor chip and shows a partially formed coating similar to that shown in FIG. 9 and additionally shows an overhang (a shoulder) in the partially formed coating.
Figure 11:
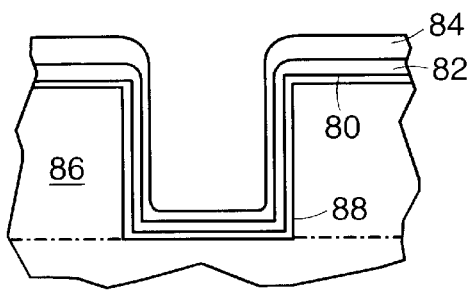
FIG. 11 is a view similar to that shown in FIG. 10 and shows a partially formed coating in a groove with the overhang (shoulder) removed.

FIG. 10 illustrates the disposition of successive layers 80, 82 and 84 of titanium, gold titanium nitride and brown titanium nitride on the surface of a silicon dioxide layer 86 and on the walls of a groove 88 in the silicon dioxide layer. As shown in FIG. 10, the brown titanium nitride layer 84 has an overhang 90 at the juncture between the surface of the layer 86 and the groove 88 in the layer. It is desirable to eliminate this overhang. Wafer bias during the deposition of the brown titanium nitride layer can accomplish this. However, such wafer bias may adversely affect the barrier properties of the titanium nitride by increasing the argon content in the layer. Furthermore, the brown titanium nitride tends to change to gold titanium nitride when even modest bias sputtering occurs.

After the brown titanium layer 84 has been deposited on the surface of the silicon dioxide layer 86 and on the walls of the groove 88, an argon etch may be provided at radio frequencies on the overhang 90 in a manner similar to that shown in FIG. 8 and discussed above. The argon etch pressure may be maintained at relatively high levels of argon and at relatively high voltages to produce a favorable redistribution of the brown titanium nitride layer 84 at the overhang 90. The brown titanium nitride layer 84 may then be exposed to air to produce surfaces of aluminum oxide on the columns 78 (see FIG. 9) in such layer.

Figure 12:
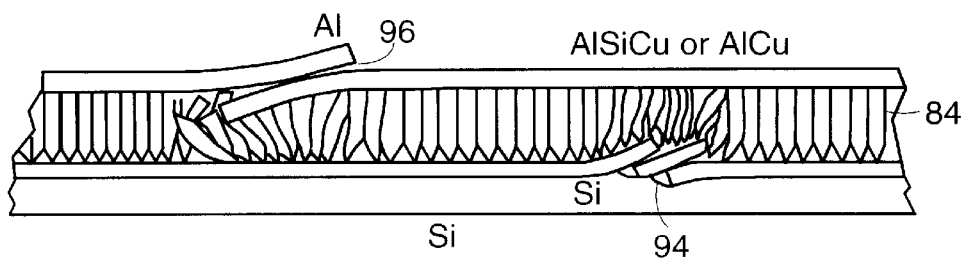
FIG. 12 is an fragmentary enlarged schematic elevational view of one embodiment of the coating of this invention and shows schematically the successive layers in the coating and how such successive layers in the coating protect against the transmigration of a conductive material above such layers through such layers to a substrate when cracks appear in the different layers.
Figure 13:
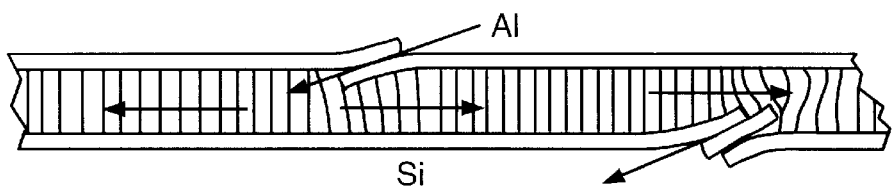
FIG. 13 is an enlarged fragmentary schematic elevational view similar to that shown in FIG. 12 but shows only certain of the layers shown in FIG. 12 and schematically shows how such layers interact to prevent conductive material above the layers from transmigrating through the layers to the substrate when cracks appear in the different layers.

A layer 90 of a suitable material such as gold titanium nitride is then deposited on the layer 76 of brown titanium nitride in a suitable thickness such as approximately four hundred Angstroms (400 Å). This is shown in FIGS. 9 and 12. A layer of a conductive material such as aluminum silicon copper (AlSiCu) or Aluminum copper (AlCu) is then deposited on the layer 80 of gold titanium nitride as shown in FIGS. 9 and 12.

The multi-layer structure produced as described above offers distinct advantages over the prior art. Although the two (2) gold titanium nitride layers 82 and 90 may micro crack as a result of stresses applied to such layers, the micro crackings will practically always occur at different positions along the layers. For example, a micro crack 94 (FIG. 12) may be produced under stress in the layer 82 and a micro crack 96 may be produced under stress in the layer 94 in displaced relationship to the microcrack 94. Because of the columnar construction of the layer 84, any diffusion of aluminum through the microcrack 96 is directed downwardly to a position in the layer 90 that is displaced from the micro crack 94. The layer then prevents any such diffused aluminum from diffusing through the microcrack 96. In this way, the layers 82, 84 and 90 prevent any aluminum in a layer 98 above the layer 90 in FIG. 10 from diffusing to the silicon substrate.

Although this invention has been disclosed and illustrated with reference to particular embodiments, the principles involved are susceptible for use in numerous other embodiments which will be apparent to persons of ordinary skill in the art. The invention is, therefore, to be limited only as indicated by the scope of the appended claims.

What is claimed is:

1. A method of forming a deposition on a substrate, including the steps of:

depositing a first layer of a barrier material on the substrate, the first layer of the barrier material having properties of microcracking in a first direction under stress, and depositing a second layer of a barrier material on the first layer, the second layer of the barrier material having properties of microvoiding, under stress, in a second direction transverse to the first direction.

2. A method as set forth in claim 1 wherein the first layer is gold titanium nitride and the second layer is brown titanium nitride.

3. A method as set forth in claim 1 wherein the first layer has a thickness of approximately three hundred Angstroms (300 Å) and the second layer has a thickness of approximately four hundred Angstroms (400 Å).

4. A method as set forth in claim 1, including the steps of:

depositing a layer of an electrically conductive material on the second layer of the barrier material, and exposing the second layer of the barrier material to air, before the deposition of the electrically conductive layer on the second layer, to inhibit the migration of the electrically conductive material to the substrate.

5. A method as set forth in claim 4 wherein the first layer of the barrier material is gold titanium nitride, and the second layer of the barrier material is brown titanium nitride.

6. A method as set forth in claim 4 wherein a third layer of barrier material is deposited on the second layer of the barrier material after the second barrier layer has been exposed to air but before the deposition of the electrically conductive layer.

7. A method of forming a deposition on a substrate, including the steps of:

depositing a first layer of a barrier material on the substrate, the first layer having properties of microcracking in a first direction when subjected to stress, depositing a second layer of a barrier material on the first layer of the barrier material, the second layer having properties of microvoiding in a second direction transverse to the first direction when subjected to stress, and depositing a third layer of a barrier material on the second layer of the barrier material, the third layer having properties of microcracking in a third direction transverse to the second direction when subjected to stress.

8. A method as set forth in claim 7, including the steps of:

depositing a barrier layer on the third layer of the barrier material.

9. A method as set forth in claim 8, including the step of:

exposing the second layer of the barrier material to air before the deposition of the third layer of the barrier material on the second layer of the barrier material to inhibit the electrically conductive material from migrating to the substrate.

10. A method as set forth in claim 9 wherein the first and third barrier layers are formed from gold titanium nitride and the second barrier layer is formed from brown titanium nitride.

11. A method as set forth in claim 9 wherein the first and third barrier layers have a thickness of approximately three hundred Angstroms (300 Å) and the second barrier layer has a thickness of approximately four hundred Angstroms (400 Å).

12. A method as set forth in claim 7 wherein the first and third barrier layers are formed from gold titanium nitride and the second barrier layer is formed from brown titanium nitride.

13. A method of forming a deposition on a substrate, including the steps of:

forming a groove in a substrate, the groove being defined by walls, depositing a first layer of a first material on the walls defining the groove, depositing a second layer of a gold titanium nitride on the layer of the first material, the gold titanium nitride having properties of microcracking in a first direction when subjected to stress, and depositing a third layer of a brown titanium nitride on the first layer of the gold titanium nitride, the brown titanium nitride having properties of microvoiding in a second direction transverse to the first direction when subjected to stress, the first material having properties of being firmly retained on the substrate and of firmly retaining the layer of the gold titanium nitride.

14. A method as set forth in claim 13, including the step of:

operating upon the layer of the brown titanium nitride to provide the layer with a substantially uniform thickness at the walls defining the groove.

15. A method as set forth in claim 13, including the step of:

etching the layer of the brown titanium nitride to redistribute the brown titanium nitride into a substantially uniform thickness at the walls of the groove after the layer of the brown titanium nitride has been deposited on the layer of the gold titanium nitride.

16. A method as set forth in claim 15, including the step of:

exposing the layer of the brown titanium nitride to air after such layer has been deposited on the layer of the gold titanium nitride to prevent any material from diffusing through the microcracks in the brown titanium nitride.

17. A method as set forth in claim 15, including the step of:

depositing a layer of a conductive material on the layer of the brown titanium nitride after the layer of the brown titanium nitride has been exposed to air.

18. A method as set forth in claim 15, including the steps of:

operating upon the layer of the brown titanium nitride to provide the layer with a substantially uniform thickness at the walls defining the groove, exposing the layer of the brown titanium nitride to air after such layer has been deposited on the layer of the gold titanium nitride to prevent any material from diffusing through the microcracks in the brown titanium nitride.

19. A method of forming a deposition on a substrate, including the steps of:

depositing a first barrier layer on the substrate, forming a groove in the first barrier layer, the groove being defined by walls, depositing a layer of a conductive material on the walls defining the groove, depositing a second layer of a barrier material on the layer of the conductive material, the second layer having properties of microcracking in a first direction when subjected to stress, and depositing a third layer of a barrier material on the second layer of the barrier material, the third layer having properties of microvoiding in a second direction transverse to the first direction when subjected to stress.

20. A method as set forth in claim 19, including the step of:

subjecting the third layer of the barrier material to air after the deposition of the third layer on the second layer of the barrier material.

21. In a method as set forth in claim 20, including the step of:

depositing a fourth layer of a barrier material on the third layer of the barrier material, the fourth layer having properties of microcracking in a direction transverse to the second direction when subjected to stress.

22. A method as set forth in claim 21, including the step of:

depositing a conductive layer on the fourth layer of the barrier material.

23. A method as set forth in claim 21, including the steps of:

etching the third layer of the barrier material to redistribute such barrier material in a substantially uniform layer on the walls defining the groove before the fourth layer of the barrier material is deposited on the third layer of the barrier material, and depositing a layer of a conductive material on the fourth layer of the barrier material.

24. A method as set forth in claim 20, including the step of:

depositing a fourth layer of a barrier material on the third layer of the barrier material, the fourth layer having properties of microcracking in a direction transverse to the second direction when subjected to stress.

25. A method as set forth in claim 24, including the step of:

etching the third layer of the barrier material to redistribute such barrier material in a substantially uniform layer on the walls defining the groove before the fourth layer of the barrier material is deposited on the third layer of the barrier material, and depositing a layer of a conductive material on the fourth layer of the barrier material.

26. A method as set forth in claim 19, including the step of:

etching the third layer of the barrier material in a direction to redistribute such barrier material in a substantially uniform layer on the walls defining the groove.

* * * * *